(12) United States Patent
Wang et al.

(10) Patent No.: US 7,233,191 B2
(45) Date of Patent: Jun. 19, 2007

(54) JFET DRIVER CIRCUIT AND JFET DRIVING METHOD

(75) Inventors: Hung-I Wang, Changhua (TW); Liang-Pin Tai, Tainan (TW)

(73) Assignee: Richtek Technology Corp., Hsinchu (TW)

( * ) Notice: Subject to any disclaimer, the term of this patent is extended or adjusted under 35 U.S.C. 154(b) by 200 days.

(21) Appl. No.: 11/128,200

(22) Filed: May 13, 2005

(65) Prior Publication Data

US 2005/0258458 A1    Nov. 24, 2005

(30) Foreign Application Priority Data

May 18, 2004    (TW) .............................. 93113987 A

(51) Int. Cl.
*H03K 17/687*    (2006.01)
(52) U.S. Cl. .................................. 327/430
(58) Field of Classification Search ................ 327/427, 327/430–431, 434–435, 437, 389, 391, 374–377
See application file for complete search history.

(56) References Cited

U.S. PATENT DOCUMENTS

| | | | | |
|---|---|---|---|---|
| 6,333,665 B1* | 12/2001 | Ichikawa | ..................... | 327/434 |
| 6,373,296 B1* | 4/2002 | Auer et al. | ................. | 327/108 |
| 7,034,600 B2* | 4/2006 | Scheikl | ....................... | 327/376 |
| 7,061,301 B2* | 6/2006 | Pham | .......................... | 327/427 |
| 7,151,401 B2* | 12/2006 | Inoue | .......................... | 327/434 |

* cited by examiner

*Primary Examiner*—My-Trang Nu Ton
(74) *Attorney, Agent, or Firm*—Rosenberg, Klein & Lee

(57) ABSTRACT

To turn on a JFET, a two-stage turn-on current control is employed in a JFET driver circuit and a JFET driving method, by which a shortly pulsed high sourcing current is provided to turn on the JFET rapidly and efficiently, and a continuous low sourcing current is provided after the JFET turns on for reducing the power dissipation. After the JFET turns off, a negative charge pump is also employed to promise the JFET at a turn-off state. A special power sequence is further employed to ensure the JFET could be turned off during the power supply coupled to the JFET starts up.

9 Claims, 11 Drawing Sheets

JFET DRIVER CIRCUIT AND JFET DRIVING METHOD

FIELD OF THE INVENTION

The present invention is related generally to a driver circuit and a driving method, and more particularly, to a JFET driver circuit and a JFET driving method.

BACKGROUND OF THE INVENTION

Conventionally, a DC-to-DC converter employs Metal-Oxide-Semiconductor Field-Effect Transistors (MOSFETs) in its power stage to serve as the high-side and low-side switches alternatively switched to convert a supply voltage to a desired output voltage. However, when semiconductor processes are developed to shrink integrated circuits more and more, the function of a MOSFET is limited due to the high conductive resistance and large gate capacitance of the MOSFET, and thereby the design requirements are not satisfied any more. Recently, Junction Field-Effect Transistors (JFETs) attract circuit designers' attention more and more, for a JFET has a lower conductive resistance and smaller gate capacitance than a MOSFET. Unfortunately, conventional MOSFET driver circuits are not applicable for JFET driver circuits, and therefore it is required to find new solution for driving JFETs.

A current art uses a conventional MOSFET driver in association with an RC circuit outside of the MOSFET driver chip to drive a JFET. As shown in FIG. 1, a conventional JFET driver circuit 100 comprises a switching circuit composed of PMOSFET 102 and NMOSFET 104 coupled between a voltage VDD and ground GND, which are alternatively switched by a voltage signal Vs to generate a voltage signal 106 having a high level 108 approximately equal to VDD and a low level 110 approximately equal to zero, and the voltage signal 106 is supplied to an RC circuit composed of a current limit resistor 112 and a capacitor 114 shunt to the resistor 112, to thereby generate a JFET driving signal 116. The capacitor 114 is charged and discharged by the voltage signal 106 in the manner that, during the high level 108 of the voltage signal 106, the capacitor 114 is charged to thereby have the JFET driving signal 116 at a high level 118 of about 0.7V, and in response to the voltage signal 106 transiting to the low level 110, the capacitor 114 begins to discharge, resulting in the JFET driving signal 116 suddenly dropping to a low level 120 of about −(VDD−0.7V) and then increasing gradually.

In the conventional JFET driver circuit 100, the turn-on speed of the driven JFET 122 is determined by the current flowing through the resistor 112, and therefore, for a greater current to turn on the JFET 122 more rapidly, the resistor 112 has a lower resistance. However, a greater current results in a greater power dissipation, and thus conflict is present between the turn-on speed and the power dissipation. Namely, the fast turn-on of a JFET is achieved always together with a high power dissipation. In addition, referring to the JFET driving signal 116 shown in FIG. 1, due to the RC leakage, it is hard to hold a negative turn-off voltage for the driven JFET 122. During the low level 110 of the voltage signal 106, the JFET driving signal 116 will increase gradually, and the JFET 122 may not maintained at the turn-off state. Moreover, if the JFET 122 is a depletion type device, it is hard to promise a turn-off state of the JFET 122 at power start-up state. In detail, at a power start-up of the power supply Vin coupled to the JFET 122, the increasing voltage Vin is applied to the JFET 122, while the conventional JFET driver circuit 100 is unable to turn off the JFET 122 in time. As a result, the power supply Vin will be directly short to ground GND or to the load circuit coupled to the power stage of the converter.

Therefore, it is desired a JFET driver circuit and a JFET driving method, by which low power dissipation, rapid and efficient turn-on of a JFET, holding a negative turn-off voltage for a depletion type JFET, and ensuring a turn-off state of a JFET at power start-up state are all achieved.

SUMMARY OF THE INVENTION

One object of the present invention is to provide a JFET driver circuit and a JFET driving method.

Specifically, one object of the present invention is to provide a JFET driver circuit and a JFET driving method, by which a JFET is turned on rapidly and efficiently.

It is also an object of the present invention to provide a JFET driver circuit and a JFET driving method to ensure a JFET to turn off when the power supply coupled to the JFET starts up.

Yet another object of the present invention is to provide a JFET driver circuit and a JFET driving method for low power dissipation.

Briefly, a two-stage turn-on current control is proposed to turn on a JFET rapidly and efficiently.

Specifically, in a JFET driver circuit and a JFET driving method according to the present invention, a shortly pulsed high sourcing current is provided to turn on a JFET rapidly, and a continuous low sourcing current is provided when the JFET turns on.

Briefly, according to the present invention, a negative charge pump is further employed to provide a negative voltage in a JFET driver circuit and by a JFET driving method to promise a JFET at a turn-off state.

Briefly, a special power sequence is also provided according to the present invention for a JFET driver circuit and a power stage to ensure a JFET in the power stage at a turn-off state when the power supply coupled to the JFET starts up.

Particularly, a JFET driver circuit and a JFET driving method according to the present invention can drive both enhancement type JFET and depletion type JFET.

In a JFET driver circuit and JFET driving method according to the present invention, a first current source coupled with a standby power is switched by a first control signal to provide a high current to a JFET when the JFET is to be turned on, and to stop providing the high current to the JFET after the JFET turns on, a second current source is switched by a second control signal to provide a low current to the JFET when the JFET is conductive, and a negative charge pump is switched to generate a negative voltage for the JFET at a turn-off state. Moreover, the standby power starts up before the power supply coupled to the JFET, such that the JFET is ensured to be turn off at the start-up of the power supply.

In another JFET driver circuit and JFET driving method according to the present invention, two current sources are switched to supply a high current and a low current to a driving element to generate a JFET driving signal to switch a JFET, such that a higher current is applied to the JFET to turn on the JFET rapidly, and a lower current is applied to the JFET when the JFET is conductive for reducing the power dissipation. Furthermore, a negative charge pump is switched to provide a negative voltage for the JFET at a turn-off state.

Alternatively, in yet another JFET driver circuit and JFET driving method according to the present invention, a driving element coupled with a control signal is switched to generate a JFET driving signal to switch a JFET, a first current source is switched to provide a first current when the JFET is to be turned on, and to stop providing the first current after the JFET turns on, a second current source is switched to provide a second current related to the first current to supply to the driving element when the JFET is to be turned on, and to provide a third current lower than the second current to supply to the driving element after the JFET turns on, such that a higher current is applied to the JFET to turn on the JFET rapidly, and a lower current is applied to the JFET when the JFET is conductive for reducing the power dissipation. Furthermore, a negative charge pump is switched to provide a negative voltage for the JFET at a turn-off state.

BRIEF DESCRIPTION OF DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 1:
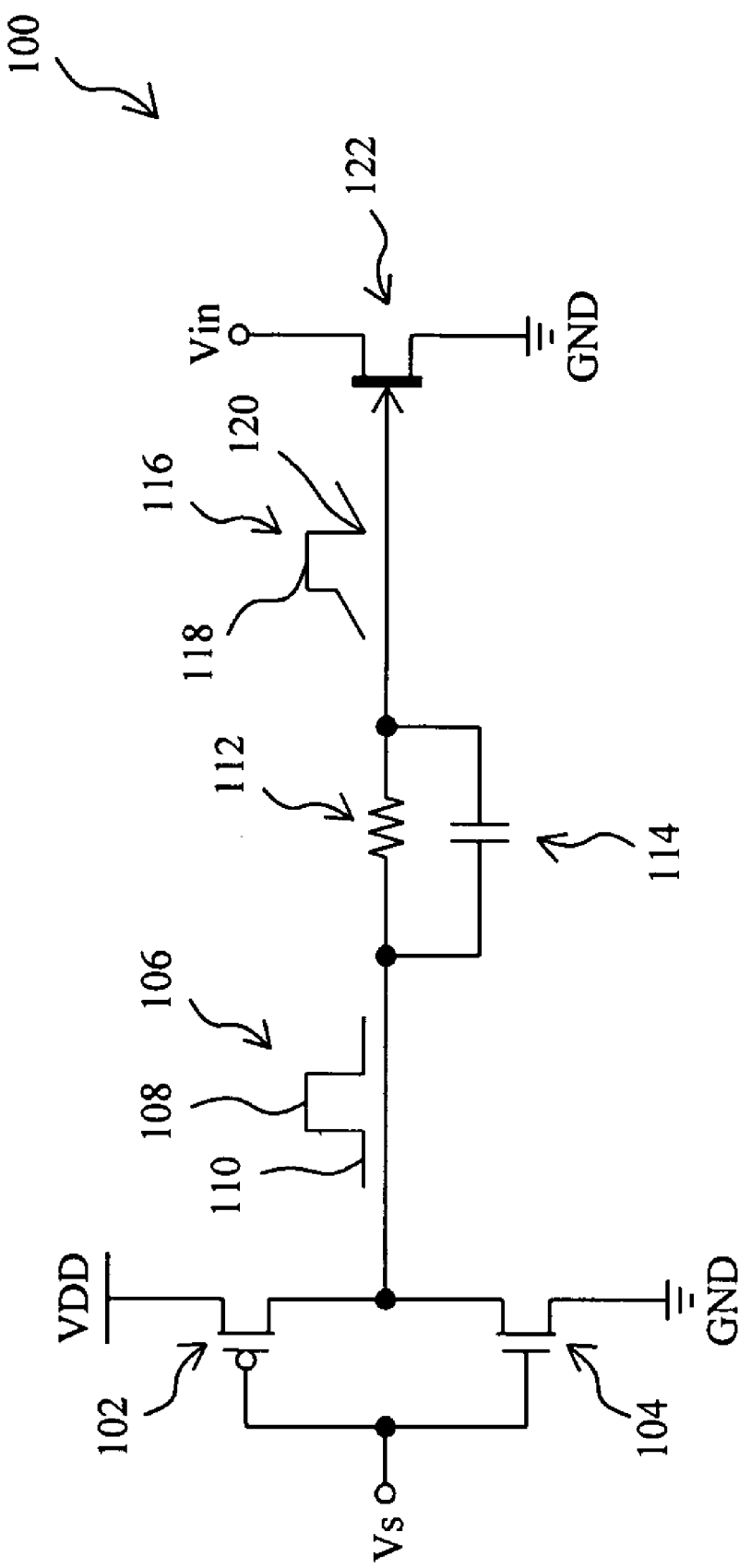
FIG. 1 shows a conventional JFET driver circuit.
Figure 2:
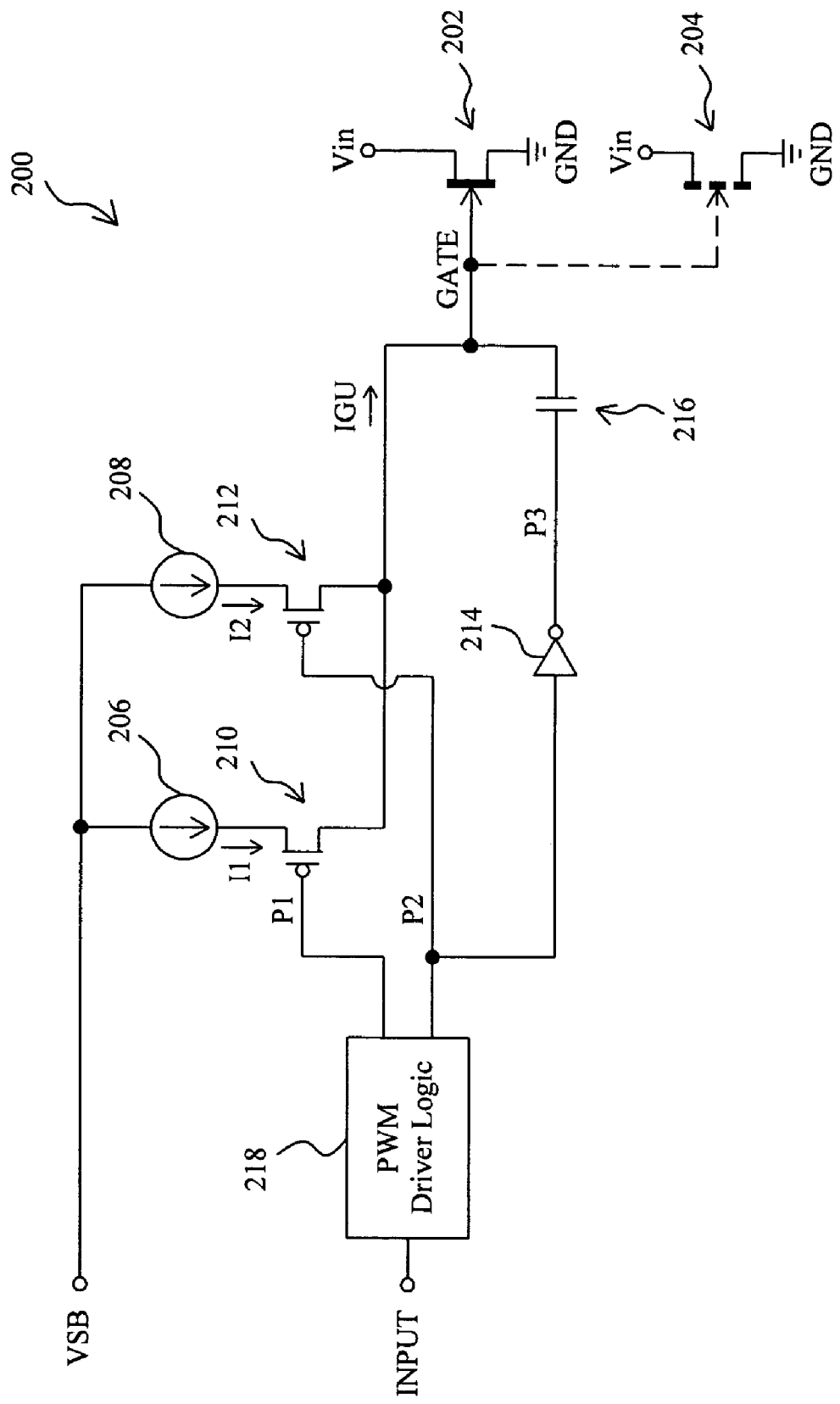
FIG. 2 shows a first embodiment of a JFET driver circuit according to the present invention.

FIG. 2 shows a JFET driver circuit 200 according to the present invention, which comprises two current sources 206 and 208 coupled with a standby power VSB for generating a high current I1 and a low current I2 respectively, two PMOSFETs 210 and 212 coupled between the current sources 206 and 208 and a gate of a depletion type JFET 202 respectively, to serve as switches for switching the high current I1 and the low current I2 to the gate of the depletion type JFET 202, a PWM driver logic 218 to provide two control signals P1 and P2 upon an input signal INPUT for switching the PMOSFETs 210 and 212 to thereby determine a current IGU, a capacitor 216 serving as a negative charge pump to provide a negative voltage to the gate of the depletion type JFET 202, and an inverter 214 to invert the control signal P2 to produce a control signal P3 coupled to the capacitor 216 for negative voltage pumping. By the JFET driver circuit 200, a JFET driving signal GATE is generated based on the control signal P3 and the current IGU for driving the depletion type JFET 202. In some other embodiments, however, the JFET driver circuit 200 may be applicable for driving an enhancement type JFET 204, as shown by dashed line in FIG. 2.

Figure 3:
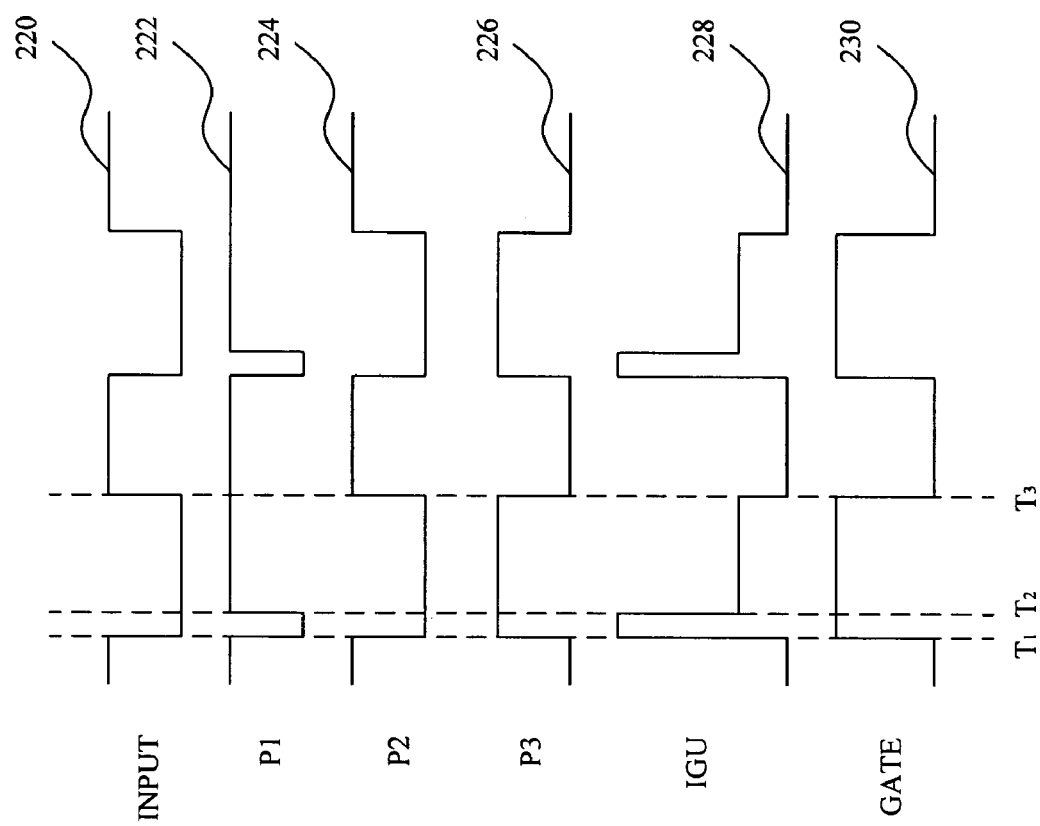
FIG. 3 shows a timing diagram of several signals in the circuit of FIG. 2.

FIG. 3 shows a timing diagram of several signals in the circuit of FIG. 2, in which waveform 220 represents the input signal INPUT, waveform 222 represents the control signal P1, waveform 224 represents the control signal P2, waveform 226 represents the control signal P3, waveform 228 represents the current IGU, and waveform 230 represents the JFET driving signal GATE. Referring to FIGS. 2 and 3, at time T1, upon the input signal INPUT, the control signals P1 and P2 transit to low level, thereby turning on the PMOSFETs 210 and 212, and thus the current $$IGU = I1 + I2 \qquad \text{[EQ-1]}$$

At the same moment, the control signal P3, produced by inverting the control signal P2 by the inverter 214, transits to high level, such that the JFET driving signal GATE instantly changes to high level of about 0.7V, and therefore the depletion type JFET 202 rapidly turns on. To reduce power dissipation, after the depletion type JFET 202 turns on, the control signal P1 transits to high level, as shown at time T2, so as to turn off the PMOSFET 210, and thus the current $$IGU = I2 \qquad \text{[EQ-2]}$$

After the depletion type JFET 202 turns on for a period, the control signal P2 transits to high level, as shown at time T3, so as to turn off the PMOSFET 212, and thus the current IGU is zero. Generated by inverting the control signal P2, the control signal P3 transits to low level at time T3, which instantly changes the JFET driving signal GATE from about 0.7V to a negative voltage, and by which the depletion type JFET 202 is maintained at the turn-off state. As shown by this embodiment, two-step pull-up current sourcing and negative charge pumping are used for driving the JFET 202. By using the negative charge pump, there is no leakage issue, and it is therefore easy to hold a negative voltage on the gate of the JFET 202 to promise the JFET 202 at the turn-off state, even though the JFET 202 is a depletion type device. Referring to the waveform 228 of the current IGU, by using a shortly pulsed high sourcing current I1, provided by the current source 206, the JFET 202 is applied with a high pull-up current on its gate and thereby turns on rapidly and efficiently. On the other hand, after the JFET 202 turns on, a continuous low sourcing current I2, provided by the current source 212, is applied on the gate of the JFET 202, and therefore low power dissipation is achieved.

Figure 4:
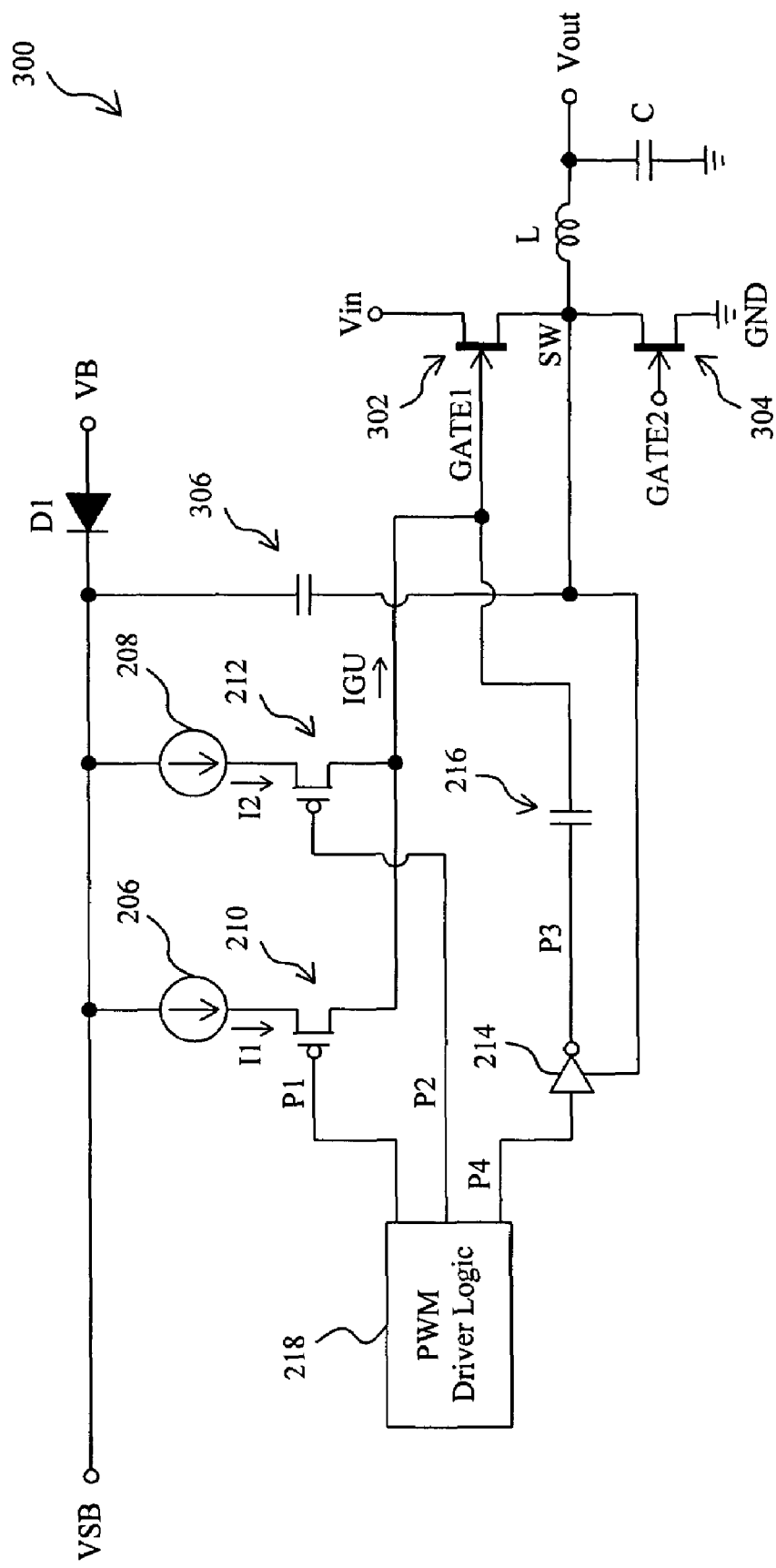
FIG. 4 shows a second embodiment of a JFET driver circuit according to the present invention for driving a high-side JFET in a power stage of a synchronous DC-to-DC converter.

FIG. 4 shows a JFET driver circuit 300 according to the present invention for driving a high-side JFET 302 in a power stage of a synchronous DC-to-DC converter. In the power stage, the high-side JFET 302 is coupled between a power supply Vin and a phase node SW, a low-side JFET 304 is coupled between the phase node SW and ground GND, and by alternatively switching the high-side JFET 302 and the low-side JFET 304, the supply voltage Vin is converted to an output voltage Vout. In the JFET driver circuit 300, the current sources 206 and 208, the standby power VSB, the PMOSFETs 210 and 212, the inverter 214, the capacitor 216 and the PWM driver logic 218 behave similar to the respective elements in the circuit 200 of FIG.

2. However, a capacitor 306 is additionally coupled between the current sources 206 and 208 and the phase node SW, such that the voltage supplied to the current sources 206 and 208 varies with the voltage on the phase node SW. Moreover, another voltage VB is also coupled to the current sources 206 and 208 through a diode D1. In this embodiment, therefore, the current sources 206 and 208 will generate the high current I1 and the low current I2 based on the standby power VSB, the voltage on the phase node SW, and the voltage VB. The PWM driver logic 218 further provides a control signal P4, and the inverter 214 inverts the control signal P4 to generate the control signal P3 coupled to the capacitor 216, such that the capacitor 216 generates a JFET driving signal GATE1 based on the current IGU and the control signal P3 for driving the high-side JFET 302. The current IGU is also determined by the equation EQ-1, while the control signal P4 may be or may not be the same as the control signal P2.

Figure 5:
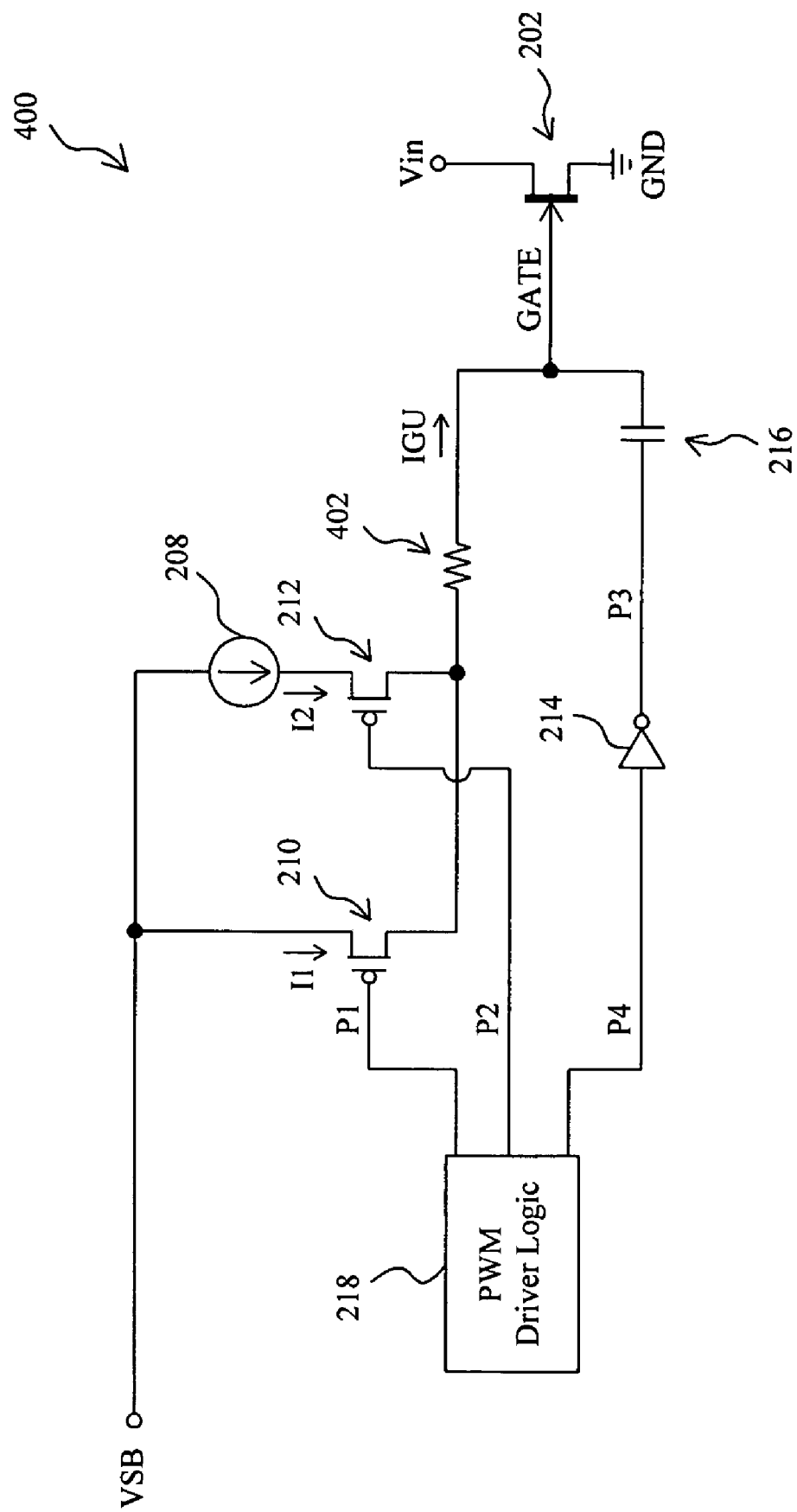
FIG. 5 shows a third embodiment of a JFET driver circuit according to the present invention.

FIG. 5 shows another JFET driver circuit 400 according to the present invention, which also comprises the current source 208, the standby power VSB, the PMOSFETs 210 and 212, the inverter 214, the capacitor 216 and the PWM driver logic 218, as does the circuit 200 of FIG. 2. In the JFET driver circuit 400, however, a current limit resistor 402 is inserted between the PMOSFET 210 and a gate of the driven JFET 202, in replacement of the current source 206 between the standby power VSB and the PMOSFET 210 in FIG. 2, so as to apply a high pull-up current to the gate of the JFET 202 by turning on the PMOSFET 210. However, for providing a shortly pulsed high sourcing current to turn on the JFET 202 rapidly, the current limit resistor 402 may be alternatively inserted between the standby power VSB and the PMOSFET 210. Referring to FIG. 5, when the control signal P1 is at low level and the JFET 202 is conductive, the voltage difference between the gate and the source of the JFET 202 is about 0.7V, and the current flowing through the PMOSFET 210 is $$I1 = (VSB - 0.7)/R, \qquad [\text{EQ-3}]$$

where R is the resistance of the current limit resistor 402. The inverter 214 inverts the control signal P4 provided by the PWM driver circuit 218 to generate the control signal P3, and the capacitor 216 generates a JFET driving signal GATE based on the current IGU and the control signal P3 to drive the JFET 202. The current IGU is also determined by the equation EQ-1, while the control signal P4 may be or may not be the same as the control signal P2.

Figure 6:
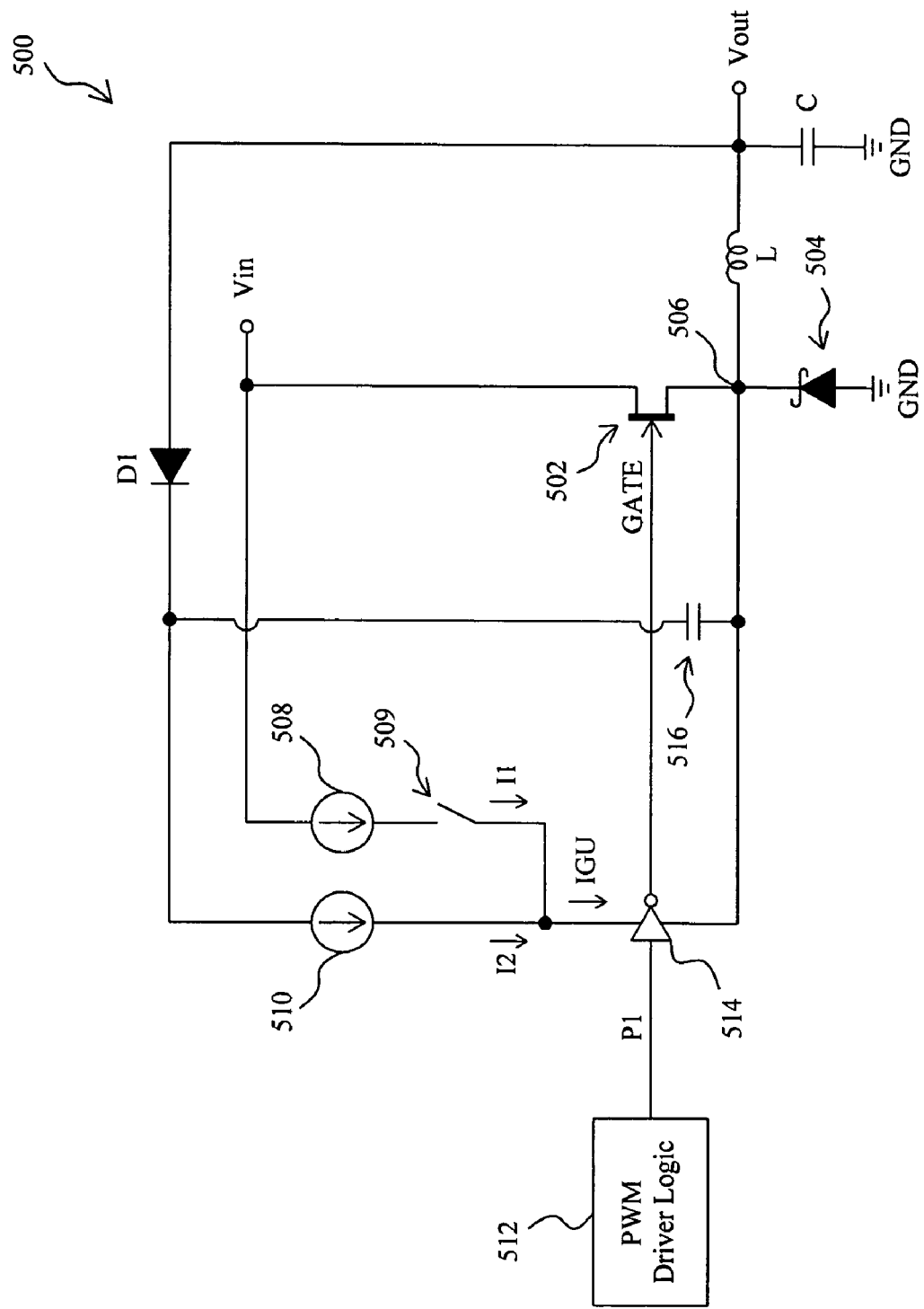
FIG. 6 shows a forth embodiment of a JFET driver circuit according to the present invention for driving a high-side JFET in a power stage of an asynchronous DC-to-DC converter.

FIG. 6 shows another JFET driver circuit 500 according to the present invention for driving a JFET 502 in a power stage of an asynchronous DC-to-DC converter. In the power stage, the high-side JFET 502 is coupled between a power supply Vin and a phase node 506, a diode 504 is coupled between the phase node 506 and ground GND, and the high-side JFET 502 is switched by a JFET driving signal GATE to thereby convert the supply voltage Vin to an output voltage Vout. In the JFET driver circuit 500, a current source 508 is coupled between the power supply Vin and a switch 509 to generate a high current I1, a current source 510 is coupled with the output voltage Vout through a diode D1 to provide a low current I2, a PWM driver logic 512 provides a control signal P1 for an inverter 514 that serves as a driving element to produce a JFET driving signal GATE for driving the high-side JFET 502, and a capacitor 516 is coupled between the current source 510 and the phase node 506 for the current source 510 to generate the low current I2 based on the output voltage Vout and the voltage on the phase node 506. The combination of the low current I2 with the high current I1 is provided for a bias current IGU of the inverter 514, and the voltage on the phase node 506 is also fed back for a bias of the inverter 514. To turn on the JFET 502, a large turn-on current is applied on the gate of the JFET 502 by turning on the switch 509 to provide the high current I1 to the inverter 514, and thereby the JFET 502 turns on rapidly. In this case, the bias current IGU supplied to the inverter 514 is determined by the equation EQ-1. After the voltage on the phase node 506 goes high, the switch 509 turns off, and only the low current I2 provided by the current source 510 remains to maintain the JFET 502 conductive, for reducing the power dissipation. The control signal P1 is a pulse width modulation (PWM) signal, and when it switches from low level to high level, the output of the inverter 514, i.e., the JFET driving signal GATE, will be maintained at a constant voltage to have the JFET 502 at the turn-off state.

Figure 7:
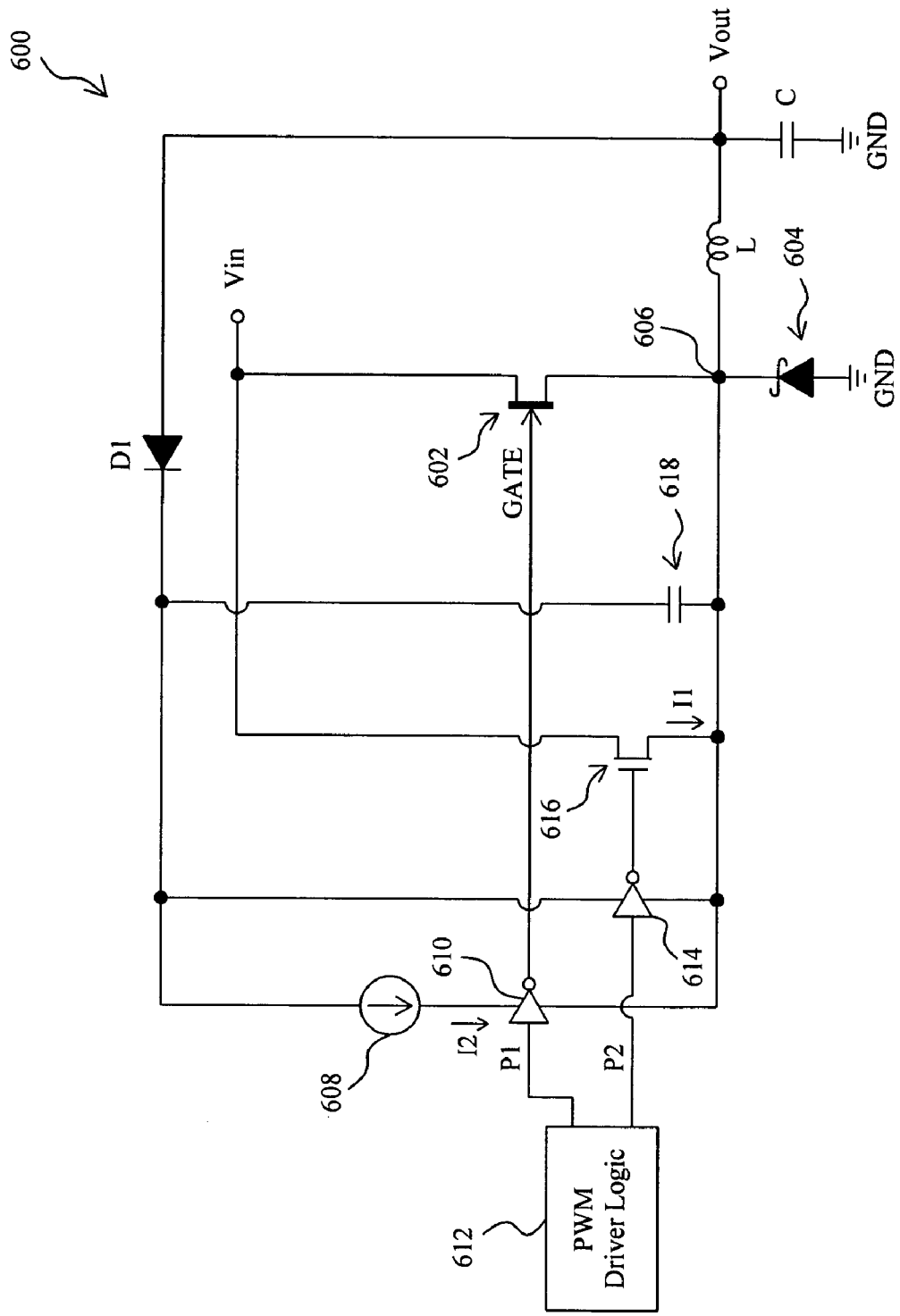
FIG. 7 shows a fifth embodiment of a JFET driver circuit according to the present invention for driving a high-side JFET in a power stage of an asynchronous DC-to-DC converter.

The JFET driver circuit 500 of FIG. 6 is modified to be a JFET driver circuit 600 shown in FIG. 7. In a power stage of an asynchronous DC-to-DC converter, a high-side JFET 602 is coupled between a power supply Vin and a phase node 606, a diode 604 is coupled between the phase node 606 and ground GND, and the high-side JFET 602 is switched by a JFET driving signal GATE to convert the supply voltage Vin to an output voltage Vout. In the JFET driver circuit 600, a current source 608 is coupled with the output voltage Vout through a diode D1 to provide a low current I2 for a bias of an inverter 610, a PWM driver logic 612 provides a control signal P1 for the inverter 610 to produce the JFET driving signal GATE for driving the high-side JFET 602, the PWM driver logic 612 also provides a control signal P2 for an inverter 614 to switch an NMOSFET 616 for providing a high current I1, and a capacitor 618 is coupled between the phase node 606 and the current source 608 for the current source 608 to generate the low current I2 based on the output voltage Vout and the voltage on the phase node 606. The phase node 606 is coupled to a bias of the inverter 610 and a bias of the inverter 614, the output voltage Vout is also coupled to the inverter 614 through the diode D1 for a bias thereof. The NMOSFET 616 is coupled between the power supply Vin and the phase node 606 to serve as a large current source, so as to influence the voltage on the phase node 606 by the current I1 it provides. To turn on the JFET 602, the NMOSFET 616 turns on and thereby generates the current I1 to change the voltage on the phase node 606, such that the inverter 610 applies a larger current to turn on the JFET 602 rapidly. After the voltage on the phase node 606 goes high, the NMOSFET 616 is turned off by the inverter 614, and therefore the inverter 610 applies a smaller current to maintain the JFET 602 conductive for reducing the power dissipation. The control signal P1 is a PWM signal, and when it switches from low level to high level, the output of the inverter 610, i.e., the JFET driving signal GATE, will be maintained at a constant voltage to have the JFET 602 at the turn-off state.

Figure 8:
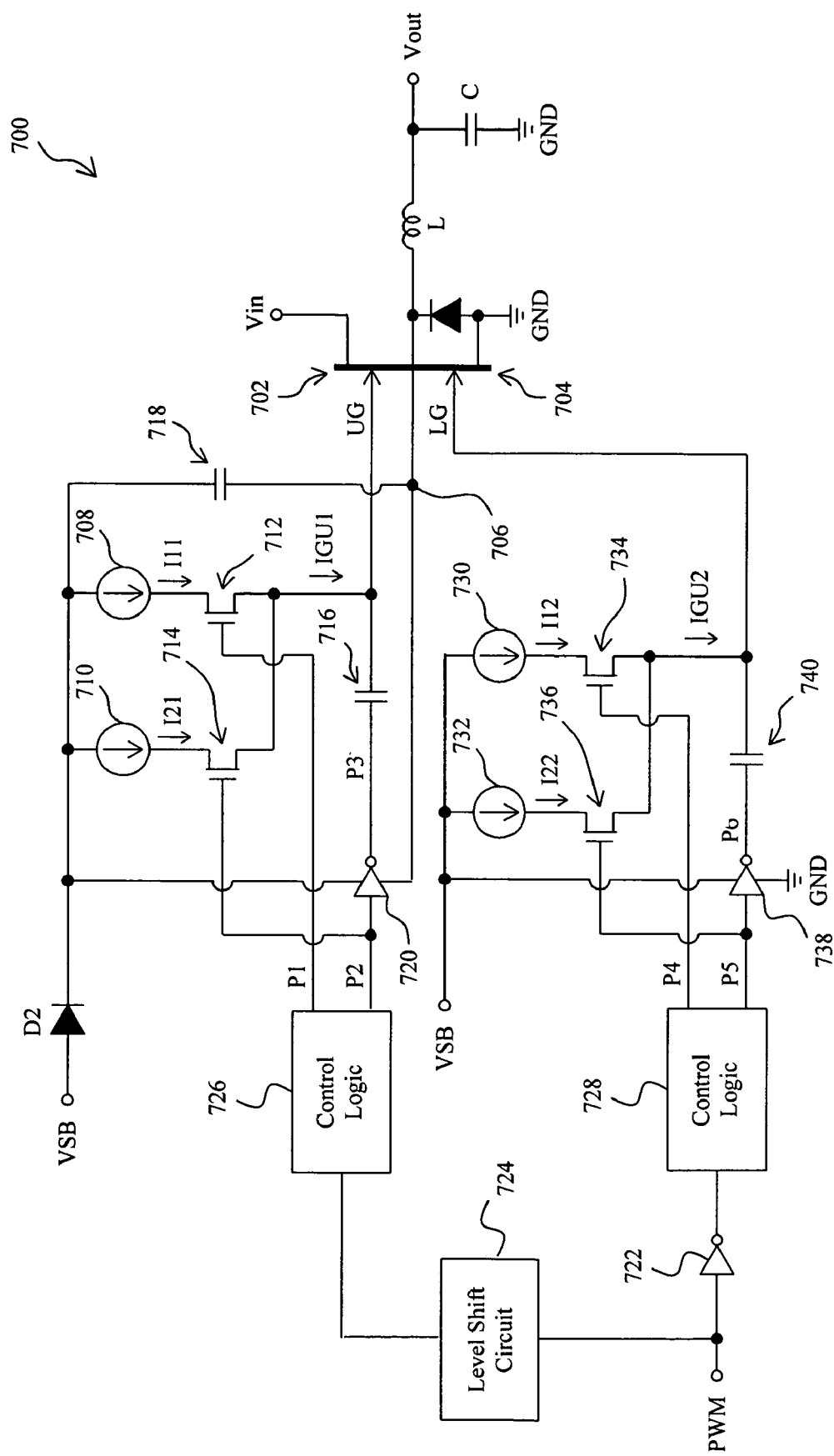
FIG. 8 shows a synchronous buck converter that employs the JFET driver circuit of FIG. 2.

FIG. 8 shows a synchronous buck converter 700 that employs the JFET driver circuit 200 of FIG. 2. In the DC-to-DC converter 700, a high-side JFET 702 and a low-side JFET 704 integrated on a chip are coupled between a power supply Vin and ground GND with the interconnection between the JFETs 702 and 704 as the phase node 706, the JFETs 702 and 704 are alternatively switched by JFET driving signals UG and LG respectively, to generate an output voltage Vout. The circuit to drive the high-side JFET 702 comprises two current sources 708 and 710 coupled with a standby power VSB through a diode D2 to generate a high current I11 and a low current I21, two NMOSFETs 712 and 714 coupled between the current sources 708 and 710 and a gate of the high-side JFET 702 respectively, a level shift circuit 724 to level shift a pulse width modulation signal PWM for an input of a control logic 726 to generate two control signals P1 and P2 to switch the NMOSFETs 712 and 714 to determine a current IGU1 supplied to a gate of the high-side JFET 702, a capacitor 716 serving as a negative charge pump to generate a JFET driving signal UG based on a control signal P3 and the current IGU1 for driving the high-side JFET 702, a capacitor 718 coupled between the phase node 706 and the current sources 708 and 710, and an inverter 720 biased by the standby power VSB and the voltage on the phase node 706 to invert the control signal P2 to produce the control signal P3. Likewise, the circuit to drive the low-side JFET 704 comprises two current sources 730 and 732 coupled with the standby power VSB to generate a high current I12 and a low current I22, two NMOSFETs 734 and 736 coupled between the current sources 730 and 732 and a gate of the low-side JFET 704 respectively, an inverter 722 to invert the signal PWM for an input of a control logic 728 to generate two control signals P4 and P5 to switch the NMOSFETs 734 and 736 to determine a current IGU2, an inverter 738 biased by the standby power VSB and ground potential to invert the control signal P5 to produce a control signal P6, and a capacitor 740 serving as a negative charge pump to generate a JFET driving signal LG based on the control signal P6 and the current IGU2 for driving the low-side JFET 704.

Figure 9:
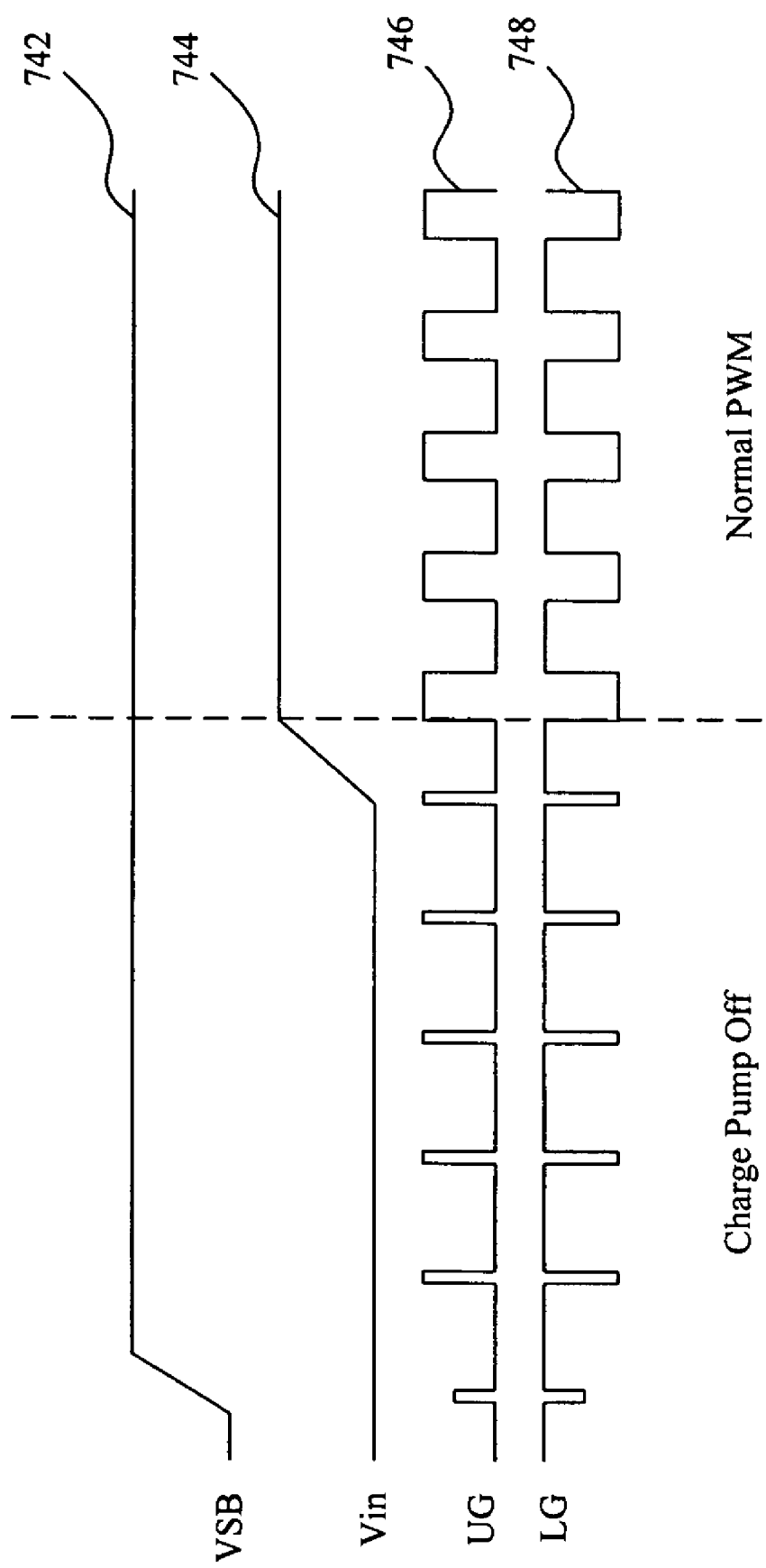
FIG. 9 shows a timing diagram of several signals in the circuit of FIG. 8.

FIG. 9 shows a timing diagram of several signals in the circuit of FIG. 8, in which waveform 742 represents the voltage provided by the standby power VSB, waveform 744 represents the voltage provided by the power supply Vin, waveform 746 represents the JFET driving signal UG, and waveform 748 represents the JFET driving signal LU. According to the present invention, a power sequence is so provided that the standby power VSB starts up before the power supply Vin, as shown by the waveforms 742 and 744, and therefore the JFETs 702 and 704 could be driven during the power supply Vin starts up. Namely, the JFET driver circuit is able to turn off the JFETs 702 and 704 during the power supply Vin at the start-up state. After the power supply Vin normally operated, the JFETs 702 and 704 carry out the normal PWM operations. Before the normal PWM operations, however, the standby power VSB has been active, such that the JFET driving signals UG and LG will be asserted, and during the period the charge pumps turn off. When the power supply starts up, the JFET driving signals UG and LG could promise to turn off the JFETs 702 and 704, even the normal PWM signals are not asserted.

Figure 10:
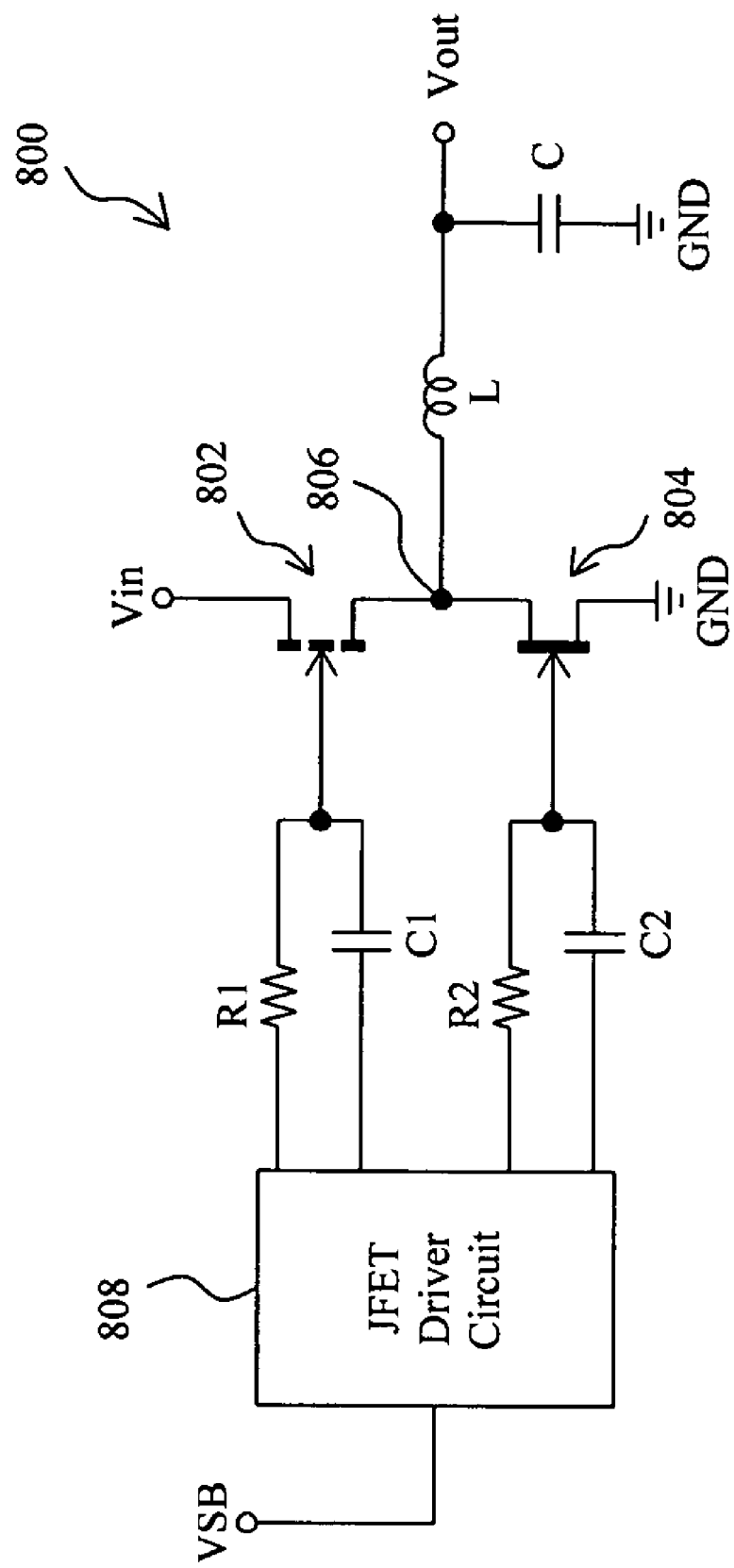
FIG. 10 shows another synchronous buck converter that employs a JFET driver circuit of the present invention.
Figure 11:
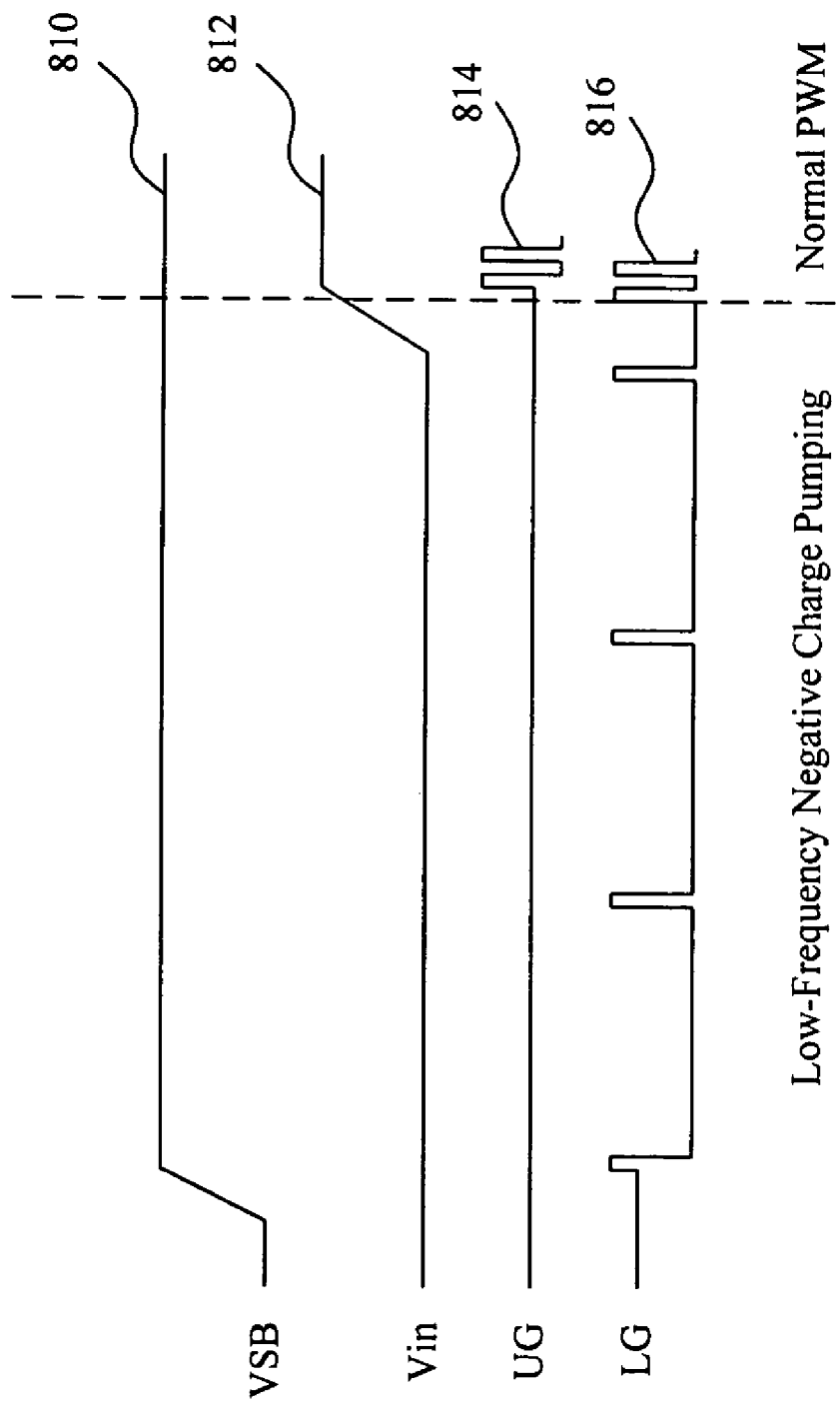
FIG. 11 shows a timing diagram of several signals in the circuit of FIG. 10.

FIG. 10 shows another synchronous DC-to-DC converter 800 that employs a JFET driver circuit of the present invention. In the DC-to-DC converter 800, an enhancement type JFET 802 is coupled between a power supply Vin and a phase node 806, a depletion type JFET 804 is coupled between the phase node 806 and ground GND, and a JFET driver circuit 808 coupled with a standby power VSB provides two JFET driving signals UG and LG for driving the enhancement type JFET 802 and the depletion type JFET 804. For the detail operations of the JFET driver circuit 808, it may refer to the circuit 400 shown in FIG. 5. FIG. 11 shows a timing diagram of several signals in the circuit of FIG. 10, in which waveform 810 represents the voltage provided by the standby power VSB, waveform 812 represents the voltage provided by the power supply Vin, waveform 814 represents the JFET driving signal UG for the high-side JFET 802, and waveform 816 represents the JFET driving signal LG for the low-side JFET 804. As in the aforementioned description, the standby power VSB starts up before the power supply Vin, as shown by the waveforms 810 and 812, such that the JFET driver circuit 808 could drive the depletion type JFET 804 by the JFET driving signal LG when the power supply Vin at the start-up state, and therefore, it is promised that the depletion type JFET 804 turns off when the power supply Vin at the start-up state. In this embodiment, since the enhancement type JFET 802 turns off when its gate is not driven by any signal, there is no need to use the standby power VSB to turn off the enhancement type JFET 802 before the power supply Vin starts up. As shown in FIG. 11, a special power sequence is provided for the standby power VSB for the JFET driver circuit 808 and the power supply Vin for the power stage, i.e., the JFETs 802 and 804, of the converter 800. Namely, the standby power VSB starts up before the power supply Vin. Since the standby power VSB (waveform 810) starts up, the JFET driving signal LG (waveform 816) for the low-side JFET 804 is asserted, while the JFET driving signal UG (waveform 814) for the high-side JFET 802 is not asserted until the power supply Vin (waveform 812) normally operates. During the period of from the start-up of the standby power VSB to the start-up of the power supply Vin, a low-frequency negative charge pumping is provided for the JFET driving signal UG of the low-side JFET 804. When the power supply Vin (waveform 812) at the start-up state, the low-side JFET 804 is ensured to be turned off by the active JFET driving signal UG (waveform 814). After the power supply Vin (waveform 812) normally operates, normal PWM signals are present on the JFET driving signals UG and LG for switching the JFETs 802 and 804, as shown by the waveforms 814 and 816.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A JFET driver circuit for driving a JFET coupled with a power supply, the JFET driver circuit comprising:
   a first current source coupled with a standby power, and upon a first control signal, for providing a first current to supply to the JFET when the JFET is to be turned on, and stopping providing the first current to the JFET after the JFET turns on;
   a second current source coupled with the standby power, and upon a second control signal, for providing a second current to supply to the JFET when the JFET is conductive; and
   a negative charge pump, upon a third control signal, for generating a negative voltage for the JFET at a turn-off state.

2. The JFET driver circuit of claim 1, further comprising an inverter for inverting the second control signal to produce the third control signal.

3. The JFET driver circuit of claim 1, wherein the negative charge pump comprises a capacitor coupled between the third control signal and the JFET.

4. The JFET driver circuit of claim 1, wherein the first current source comprises a current limit resistor coupled between the standby power and the JFET when the first current is supplied to the JFET.

5. The JFET driver circuit of claim 1, wherein the third control signal is substantially synchronous to the second control signal.

6. The JFET driver circuit of claim 1, wherein the standby power starts up before the power supply starts up.

7. A JFET driving method comprising the steps of:

in response to a first control signal for generating a first current from a standby power supply to supply to a JFET when the JFET is to be turned on, and stopping providing the first current to the JFET after the JFET turns on;

in response to a second control signal for generating a second current from the standby power supply to supply to the JFET when the JFET is conductive; and in response to a third control signal for generating a negative voltage for the JFET at a turn-off state.

8. The method of claim 7, further comprising inverting the second control signal for producing the third control signal.

9. The method of claim 7, wherein the standby power starts up before a power supply coupled to the JFET starts up.

* * * * *